United States Patent [19]

Carolan et al.

[11] Patent Number: 5,332,597
[45] Date of Patent: Jul. 26, 1994

[54] METHOD FOR MANUFACTURING INORGANIC MEMBRANES BY ORGANOMETALLIC CHEMICAL VAPOR INFILTRATION

[75] Inventors: Michael F. Carolan; Paul N. Dyer, both of Allentown; Stephen M. Fine, Emmaus; Alexander Makitka, III, Stroudsburg; Robin E. Richards, Chalfont; Leslie E. Schaffer, Macungie, all of Pa.

[73] Assignee: Air Products and Chemicals, Inc., Allentown, Pa.

[21] Appl. No.: 973,490

[22] Filed: Nov. 9, 1992

Related U.S. Application Data

[63] Continuation-in-part of Ser. No. 816,195, Jan. 2, 1992.

[51] Int. Cl.⁵ ............................................. B05D 5/00
[52] U.S. Cl. .................................. 427/243; 427/244; 427/250; 427/252; 427/255; 427/255.3
[58] Field of Search ................. 501/152, 1; 427/243, 427/244, 255.3, 252, 250, 255; 55/16, 158

[56] References Cited

U.S. PATENT DOCUMENTS 4,330,663  5/1982  Yoshisato et al. ............... 501/152
4,609,562  9/1986  Isenberg et al. ..................... 427/8
4,992,305  2/1991  Erbil ............................. 427/255.3
5,106,654  4/1992  Isenberg ........................... 427/115
5,140,003  8/1992  Mueller ......................... 427/255.3

FOREIGN PATENT DOCUMENTS 61-21717  1/1986  Japan.

OTHER PUBLICATIONS

Teraoka and coworkers, Nippon Seramikkusu Kyobai Gabujutsu Ronbushi, 97(1989) 553.

Primary Examiner—Janyce Bell
Attorney, Agent, or Firm—Keith D. Gourley; James C. Simmons; William F. Marsh

[57] ABSTRACT

The present invention is a method for manufacturing inorganic membranes which are capable of separating oxygen from oxygen-containing gaseous mixtures. The membranes comprise a porous composite of a thin layer of a multicomponent metallic oxide which has been deposited onto a porous support wherein the pores of the multicomponent metallic oxide layer are subsequently filled or plugged with a metallic-based species. The inorganic membranes are formed by depositing a porous multicomponent metallic oxide layer onto the porous support to form a porous composite having a network of pores capable of transporting gases. The network of pores are plugged or filled by organometallic vapor infiltration to form an inorganic membrane having essentially no through porosity.

24 Claims, No Drawings

METHOD FOR MANUFACTURING INORGANIC MEMBRANES BY ORGANOMETALLIC CHEMICAL VAPOR INFILTRATION

CROSS-REFERENCE TO RELATED APPLICATIONS

This application is a continuation-in-part to copending U.S. patent application Ser. No. 07/816,195, filed Jan. 2, 1992, the Specification and claims which are incorporated by reference and made a part of this application.

TECHNICAL FIELD OF THE INVENTION

The present invention presents a method for manufacturing inorganic membranes suitable for separating oxygen from oxygen-containing gaseous mixtures and the membranes formed therefrom. The method employs organometallic chemical vapor infiltration (OMCVI) for filling pores within the multicomponent metallic oxide layer of the membrane composite.

BACKGROUND OF THE INVENTION

Oxygen is required in increasingly greater quantities in industrial combustion and oxidation processes. Oxygen is typically separated from air by processes such as cryogenic distillation, adsorptive separation, chemical absorption and differential permeation through membrane media. Solid electrolyte membranes (SEMs) are currently being studied as an alternative technology for separating oxygen from oxygen-containing gaseous mixtures such as air. The most promising SEMs are formed from multicomponent metallic oxides such as titania-doped yttria-stabilized zirconia (YSZ) and praseodymia-modified zirconia.

Gas separation membranes formed from multicomponent metallic oxides are typically operated at high temperatures (e.g. 700° C. or more) wherein the membranes conduct both oxygen ions and electrons and can thereby operate without the encumbrance of external circuitry such as electrodes, interconnects and power supplies. When a difference in oxygen partial pressure exists on opposite sides of the multicomponent metallic oxide membrane and operating conditions are properly controlled, pure oxygen is produced as oxygen ions migrate to the low pressure side of the membrane while an electron flux occurs in the opposite direction in order to conserve charge.

Several laboratories are investigating methods for preparing thin films of multicomponent metallic oxides suitable for use as inorganic membranes. However, currently available preparative methods for making such thin films are not totally satisfactory. For example, stoichiometry of the multicomponent metallic oxide is sometimes difficult to control and detrimental chemical reactions sometimes occur between the multicomponent metallic oxide and the substrate due to the high temperatures required to form the required layer.

Prior art methods for making multicomponent metallic oxides include U.S. Pat. No. 4,330,663 which discloses SEMs formed from a sintered body of a multicomponent metallic oxide comprising an oxide of cobalt, an oxide of at least one metal selected from strontium and lanthanum and an oxide of at least one metal selected from bismuth and cerium. The multicomponent metallic oxides are prepared by a time-consuming method wherein lanthanum oxide, bismuth oxide and cobalt acetate are ground, fired at high temperatures, reground and sintered.

Japanese Patent Application No. 61-21717 discloses SEMs which are formed from multicomponent metallic oxides represented by the formula $La_{1-x}Sr_xCo_{1-y}Fe_yO_{3-d}$ wherein x ranges from 0.1 to 1.0, y ranges from 0.05 to 1.0 and d ranges from 0.5 to 0. The mixed oxides are prepared by heating a mixture of hydroxide precipitates formed by adding an alkaline solution such as ammonia water or caustic alkali to a solution of the metal salts. The mixture is heated at a temperature between 650° C. and 1400° C., preferably between 850° and 1260° C., for a few hours or dozens of hours depending on the temperature, and then sintered at temperatures between 1000° C. and 1500° C., preferably between 1150° and 1350° C.

Teraoka and coworkers, Nippon Seramikkusu Kyobai Gabujutsu Ronbushi, 97 (1989) 533 disclose various methods for depositing a thin $La_{0.6}Sr_{0.4}CoO_3$ perovskite multicomponent metallic oxide layer onto a porous support of the same material by an rf sputtering technique and a liquid suspension spray deposition method. The film produced by the rf sputtering method was cracked and porous. While the liquid suspension spray deposition technique produced a film approximately 15 $\mu$m thick following sintering at 1400° C. and repeated deposition/sintering cycles, the film showed unexpectedly low oxygen permeability due in part to the extremely high temperatures required to produce the desired non-porous morphology.

Y. S. Lin, in his Doctoral Thesis entitled, "Chemical and Electrochemical Vapour Deposition of Zirconia-Yttria solid Solutions in Porous Ceramic Media", Universiteit Twente, The Netherlands, defended on Jan. 3, 1992, teaches oxygen transport membranes which are prepared by electrochemical vapor deposition (ECVD) from mixtures of metal halides and water (oxygen). ECVD is a high temperature route (>800° C.) which evolves hydrogen halides, and operates with the reactants in opposition, and combines a chemical vapor infiltration (CVI) step with subsequent film growth by electrochemical transport of oxygen through the deposited layer.

U.S. Pat. No. 4,609,562 discloses an ECVD apparatus and procedure for fabricating solid oxide fuel cells. The patent states that the pressure drop across the tubular substrate must be controlled during the initial CVI step of the ECVD process. The CVI reaction was completed at 1200° C., using a 5-10 Torr pressure differential across the tube wall. A reactant mixture of $YCl_3/ZrCl_4$/argon and an oxidant composed of oxygen(20%)/water(40%)/carrier gas(40%) was employed wherein the oxidant was forced to flow through the walls of the porous tubular support. Pore closure and was indicated by a pressure rise in the tube bore which corresponded to the oxidant feed side of the tube.

An improved method is being sought for depositing a layer of a multicomponent metallic oxide onto a porous support while overcoming problems associated with membrane leakage cased by residual porosity with in the membrane. Desirably, such a method would utilize lower temperatures than previously utilized in order to promote formation of low stress coatings, to reduce chemical reactions between the multicomponent metallic oxide layer and porous support and to minimize changes in the substrate microstructure caused by heating the material at unduly high temperatures.

BRIEF SUMMARY OF THE INVENTION

The present invention describes a method for manufacturing inorganic membranes which are capable of separating oxygen from oxygen-containing gaseous mixtures at elevated temperatures. The membranes formed from this method comprise a membrane composite of a porous support layer and one or more porous multicomponent metallic oxide layers, wherein the pores of the multicomponent metallic oxide layers are plugged with a metallic oxide, metallic carbonate, metal or multicomponent metallic oxide to eliminate any through porosity within the membrane. Typically, the porous support has an average pore diameter of greater than 5 $\mu$m and each multicomponent metallic oxide layer has an average pore diameter of less than 1 $\mu$m.

Suitable porous supports for fabricating the membrane include alumina, silica, magnesia, titania, a high temperature oxygen compatible metal alloy, a metal oxide stabilized zirconia, a multicomponent metallic oxide and compounds and mixtures thereof. Suitable multicomponent metallic oxides are conducting oxides which comprise an oxide of at least two different metals or a mixture of at least two different metal oxides wherein the mixed conducting oxide demonstrates either electron conductivity, oxide ion conductivity or both at elevated temperature.

The method for manufacturing the enumerated inorganic membranes comprises the steps of depositing a porous multicomponent metallic oxide layer onto a porous support to form a porous composite having a network of pores capable of transporting gases; and contacting a first surface of the porous composite with one or more vaporized organometallic complexes and a second surface of the porous composite with a gaseous reactive agent at a temperature and a pressure sufficient to cause the organometallic complexes and the oxidizing agent to react and to form plugs within the pores of the porous composite to form an inorganic membrane having essentially no through porosity.

The method according to the present invention provides numerous advantages over prior art methods for forming inorganic membranes comprising multicomponent metallic oxides. Processing advantages include lower processing temperatures and reduced sintering times. The membranes formed therefrom exhibit reduced thermal and mechanical stress and improved chemical compatibility between the respective layers of the composite membrane. Moreover, the method seals or plugs the pores of the membrane composite thereby reducing gaseous leakage through the membrane caused by gases being transmitted through small cracks and pores. Thus, the method overcomes a significant problem in the art.

DETAILED DESCRIPTION OF THE INVENTION

The present invention is a method for manufacturing inorganic membranes which are capable of producing pure oxygen and enriching the oxygen content of gaseous streams. The membranes formed from this method comprise a composite of a porous support layer and one or more porous multicomponent metallic oxide layers, wherein the pores of multicomponent metallic oxide layers are plugged or filled with one or more metallic species to eliminate any through-porosity within the membrane.

Inorganic membranes for separating oxygen-containing gaseous mixtures into their respective components must be formed in part from materials which are capable of conducting electrons and/or oxygen ions at elevated temperatures. Inorganic membranes operate by an entirely different mechanism than polymeric membranes. While polymeric membranes rely upon differential permeation of gas molecules though the membrane to separate gaseous mixture into their respective component gases, inorganic membranes possess a nonporous structure and rely upon transport of oxygen ions across the membrane wherein the ions are converted to molecule oxygen during the process. Therefore, inorganic membranes should be entirely free of pathways such as networks of pores which would be capable of transporting gases across the membrane. This invention provides a convenient method for eliminating such undesirable porosity within the inorganic membrane by plugging or filling such pores.

The membranes of this invention are composites formed from a porous support which provides mechanical integrity, and one or more layers of multicomponent metallic oxide which, alone or in combination with the porous support, are capable of transporting oxygen ions at elevated temperatures. The pores of the multicomponent metallic oxide layer are plugged by organometallic chemical vapor infiltration (OMCVI). The OMCVI step comprises diffusing reactant gases, namely organometallic complexes, and a gaseous reactive agent comprising an oxidizing or reducing agent from opposite sides of the composite membrane under conditions sufficient to cause a reaction within the pores to deposit a plug within such pores. The composition of the plug will depend upon the selection of reactants and generally comprises a metallic oxide, a multicomponent metallic oxide, metallic carbonate or metallic species. The resultant plugs substantially reduce through-porosity within the composite membrane thereby eliminating pathways of pores capable of transmitting gases through the inorganic membrane.

A wide variety of porous supports are capable of receiving the enumerated multicomponent metallic oxides. Suitable porous supports possess a network of pores capable of transmitting the reactive gases used in the OMCVI step so that the pores may ultimately be plugged or filled. Therefore, the term, porous support, does not refer to materials which merely possess surface or closed internal porosity. The porous support may be formed of the same or similar composition as the multicomponent metallic oxide layer, an alternate multicomponent metallic oxide disclosed herein, a or conventional compatible porous support formed of an inert material which does not conduct electrons or oxygen ions at elevated temperatures. An example of the former is a porous tube extruded from $LaBa_{1-x}Co_yFe_{1-y}O_{3-z}$ (LBCFO) or $La_xSr_{1-x}Co_yFe_{1-y}O_{3-z}$ (LSCFO), and of the latter, a large pore diameter tube or sheet of MgO.

Conventional compatible porous supports include metal oxide-stabilized zirconia such as yttria-stabilized zirconia and calcia-stabilized zirconia, alumina, magnesia, silica, titania, a high temperature oxygen compatible metal alloy, and compounds and mixtures thereof. Any combination of porous support and multicomponent metallic oxide can be utilized so long as their coefficients of thermal expansion are compatible and no adverse chemical reactions occur between the porous substrate and the multicomponent metallic oxide to be deposited at operating temperatures of the inorganic membrane.

Multicomponent metallic oxides suitable for practicing the method comprise a metal oxide or an oxide of at least two different metals or a mixture of at least two metal oxides wherein the material demonstrates oxide ion conductivity when heated to an elevated temperature. A preferred type of multicomponent metallic oxide comprises a mixed conducting oxide which comprises an oxide of at least two different metals or a mixture of at least two different metal oxides wherein the mixed conducting oxide demonstrates electron conductivity as well as oxide ion conductivity at elevated temperature. Electron conductivity denotes conductivity attributed to electrons and/or electron holes and oxide ion conductivity denotes conductivity attributed to oxide ions.

In an alternate embodiment the method is capable of depositing a layer of a multicomponent metallic oxide containing a Group 2 metal. Suitable Group 2 metals are selected from the group consisting of calcium, strontium, barium and magnesium. In a preferred embodiment, the present method is particularly suited toward depositing a mixed conducting oxide represented by the structure $A_xA'_{x'}A''_{x''}B_yB'_{y'}B''_{y''}O_{3-z}$ where A,A',A'' are chosen form the group comprising Groups 1, 2, 3 and 15 and the F block lanthanides; and B,B',B'' are chosen from the D block transition metals according to the Periodic Table of the Elements adopted by the IUPAC wherein $0<x\leq 1$, $0\leq x'\leq 1$, $0\leq x''\leq 1$, $0<y\leq 1$, $0\leq y'\leq 1$, $0\leq y''\leq 1$, $x+x'+x''=1$, $y+y'+y''=1$ and z is a number which renders the compound charge neutral. Preferred mixed conducting oxides which can be deposited are represented by the formula $La_xA_{1-x}Co_y\text{-}Fe_{1-y}O_{3-z}$ wherein x is between 0 and 1, y is between 0 and 1 and A is selected from barium, strontium or calcium.

The initial step in Applicants' method comprises depositing a porous layer of one or more of the enumerated multicomponent metallic oxides onto a porous support to form a porous composite having a network of pores capable of transporting gases to be used in a subsequent method step to plug such pores. The multicomponent metallic oxide layer can be deposited onto the porous support by a variety of techniques including dip coating, pressure filtration or vacuum filtration. Alternatively, the multicomponent metallic oxide layer can be deposited onto the porous support by tape casting, coextrusion, electrophoresis and spraying techniques such are plasma spraying, arc spraying, flame spraying or aerosol spraying. An optimum combination of physical and chemical properties can be obtained on a nanometer scale by selecting different compositions for the porous support and the multicomponent metallic oxide layers.

The dip coating procedure for forming a coating of multicomponent metallic oxide onto the porous support is accomplished by forming a slurry or slip of the desired multicomponent metallic oxide. The multicomponent metallic oxide is mixed with an organic solvent mixture, an organic polymer binder, and an organic dispersant. Methanol/2-butanone was found to be a suitable solvent mixture. Polyvinylbutyral is used as a polymer binder and Menhaden fish oil is used as the dispersant. Slurries are formed by mixing these components and ball milling for a suitable time, typically 24–48 hours, using zirconia media and polyethylene jars. This procedure produces a powder slurry of well dispersed submicron particles. Slurries appropriate for casting thin films have a composition of 1–10wt % multicomponent metallic oxide powder, 1–40wt % polyvinylbutyral, 0.5–15wt % Menhaden fish oil with the remainder consisting of a 40/60 mixture of methanol and 2-butanone.

The slurry is coated onto the desired porous support by immersing or dipping the porous support into the slurry and withdrawing the coated porous substrate at a controlled rate. The porous composite is allowed to dry prior to proceeding to the next step of the method. The immersion-withdrawal-drying procedure is repeated up to 5 times in order to build up a layer of sufficient thickness. The multicomponent metallic oxide layers formed are uniform having a small pore size, adhere well to the porous support and are >95% pure as determined by X-ray diffraction. This coating procedure may be repeated if a thicker layer is desired.

In a preferred embodiment, vacuum filtration is used to coat the porous support with a layer of multicomponent metallic oxide wherein the porous support tube is immersed into a slurry of multicomponent metallic oxide and a pressure gradient is applied across the support. The pressure gradient forces the slurry into the porous composite to form a "cake filtration" layer on the high pressure side of the porous support. The pressure gradient is then released, the porous composite is withdrawn from the slip and the composite is allowed to dry. The vacuum filtration may be repeated if a thicker is desired. Multicomponent metallic oxide layers deposited onto porous supports by vacuum filtration show higher density and better conformality to the porous substrate than layers deposited by dip coating.

The next step of Applicants' method comprises contacting a first surface of the porous composite with one or more vaporized organometallic complexes and a second surface of the porous composite with a gaseous reactive agent at a temperature and a pressure sufficient to react the organometallic complexes and the gaseous reactive agent within the pores of the multicomponent metallic oxide layer to form plugs which eliminate substantially all-through porosity in the inorganic membrane. The composition of the plugs will vary depending upon the composition of the organometallic complexes and the gaseous reactive agents used.

The OMCVI step comprises independently heating one or more organometallic complexes capable of forming the desired plug to temperatures sufficient to vaporize each of the organometallic complexes; (b) introducing the vaporized organometallic complexes into a first chamber of a reactor comprising two chambers which are connected by the porous composite having a network of pores capable of transporting gases between the two chambers; introducing a gaseous reactive agent into a second chamber of the reactor; and contacting the organometallic complexes and the gaseous reactive agent in the pores of the porous composite at a temperature and a pressure sufficient to deposit plugs within the pores to form the desired inorganic membrane.

The OMCVI step is capable of depositing a solid phase of an intimate mixture of metallic oxides within the pores of the multicomponent metallic oxide layers. The step is also capable of intermixing materials which would be chemically non-compatible at the elevated temperatures required for electrochemical vapor deposition. The infiltration step preferentially forms plugs within the smallest pores of the multicomponent metallic oxide layer of the porous composite.

Applicants emphasize that mere substitution of OMCVI for Electrochemical vapor infiltration provides a method which is inoperative because the pores of conventional porous substrates cannot be fully filled as evidenced by Example 6. Applicants have discovered that a porous composite is required in order to utilize OMCVI as a practical means for plugging the pores of the multicomponent metallic oxide layer. Moreover, the average pore diameter of the porous substrate and the multicomponent metallic oxide layer must be controlled in order to force the infiltration to occur within the multicomponent metallic oxide layer.

Applicants have also discovered that closure or plugging of pores within the porous composite via OMCVI is slow and difficult to complete unless the multicomponent metallic layer of the porous composite has a narrow pore size distribution and an average pore diameter of less than 1 $\mu$m, and preferably less than 0.1 $\mu$m. Moreover, the porous support will preferably possess a large average pore diameter of greater than 1 $\mu$m, and preferably greater than 5 $\mu$m, in order to minimize pore diffusion resistance of the permeate oxygen from the inorganic membrane and to cause the plug to form preferentially in the multicomponent metallic oxide layer of the composite membrane.

Plug thickness and the location at which the plugs are deposited can be controlled by using an asymmetric porous composite meaning that the average pore diameter of each respective layer of the composite can be regulated so that deposition will preferentially occur in the layer having the smallest average pore diameter. The average pore diameter of the multicomponent metallic oxide layer can be conveniently reduced by sintering the porous composite prior to conducting the OMCVI step. Sintering is accomplished by heating the porous composite at a temperature ranging from 500° C. to 1500° C. for a period ranging from 10 minutes to twenty-four hours. Sintering can be accomplished at a heating rate of 1° to 5° C./min to a temperature of 500° to 1500° C. for a period ranging from 10 minutes to 5 hours. Heat treatment may be carried out by utilizing direct heating with an electrical heater as well as indirect heating using a high temperature gas such as a high-temperature combustion gas.

Plugs comprising multicomponent metallic oxides, metallic oxides and metallic carbonates containing barium, cobalt, strontium and magnesium can be conveniently prepared by using organometallic complexes based on $\beta$-diketone ligands including $Ba_4(thd)_8$, $Co(thd)_2$, $Mg(thd)_2$ and $Sr(thd)_2$ and an oxidizing agent including but not limited to oxygen, air, ozone, $N_2O$ and water. $(Ba)_4(thd)_8$ is prepared according to the procedures known in the art. The $Co(thd)_2$ and $Sr(thd)_2$ may be obtained from commercial suppliers, for example Epichem Limited, UK, or Strem Chemicals, Inc., Newburyport, Mass. Plugs comprising metals in a zero oxidation state may be formed by reacting the enumerated organometallic complexes with a reducing agent such as $H_2$, CO and water.

A mixture of organometallic complexes and the desired oxidizing agent or reducing agent are diffused through opposite sides of the porous composite and reacted to form plugs within the multicomponent metallic oxide layer having the most narrow average pore diameter. Upon understanding the nature of the present invention, one of ordinary skill in the art can readily select organometallic complexes capable of reacting with the gaseous reacting agents to form the desired plugs which may comprise a metallic oxide, a multicomponent metallic oxide, a metallic carbonate, or a metallic layer.

The OMCVI step can be completed in any conventional chemical vapor deposition reactor according to the following general procedure. The desired organometallic complexes of at least two different metals capable of forming the plugging composition are individually heated to a temperature sufficient to vaporize each respective organometallic complex. Suitable vaporizing temperatures are easily determined by those of ordinary skill in the art and will vary depending upon the desired vapor pressure of the organometallic complex and the desired growth rate of the plugs.

For example, the organometallic complexes can be placed into a plurality of beds which are in communication with the reactor. The number of beds to be used is based on the number of organometallic complexes necessary to form the desired multicomponent metallic oxide. The organometallic complexes are then independently heated in separate beds to a temperature sufficient to create the desired vapor pressure of the respective complex. The beds can be heated by any conventional method including, but not limited to, resistance heating and induction heating.

Suitable temperatures for vaporizing the $(Ba)_4(thd)_8$, $La(thd)_3$, $Co(thd)_2$, and $Fe(thd)_3$ are 200°-250° C., 160°-200° C., 100°-140° C. and 100°-140° C. respectively. At the lower limits, the sources are below the organometallic complex melting points. The upper limits are well below the thermal decomposition temperatures of the melts which are greater than 300° C. as defined by differential scanning calorimetry. When preparing the above-mentioned multicomponent metallic oxides containing barium, $BaCO_3$ formation is not detected by XRD despite the thermodynamic stability of $BaCO_3$. The use of $(Ba)_4(thd)_8$ circumvents problems associated with other barium sources such as $Ba(hfac)_2$tetraglyme and provides a significant process advantages for depositing films of multicomponent metallic oxides at moderate temperatures.

A predetermined amount of the vaporous organometallic complexes is contacted with a first side of the porous composite, typically by means of an inert carrier gas. Suitable inert gases include those gases which will not react with the organometallic complexes or porous support under the enumerated method conditions. Representative inert gases include argon, nitrogen and helium.

A gaseous reactive agent, which may be either a reducing agent or an oxidizing agent depending upon the desired composition of the plugs to be formed, is contacted with the other side of the porous composite. The amount of gaseous reactive agent used may vary depending upon the particular organometallic complexes used, the ease of oxidation or reduction of the complexes and the like. Preferably, an amount of gaseous reactive agent is used so as to provide sufficient oxidation or reduction of the organometallic complexes to minimize formation of secondary phases.

The organometallic complexes and the desired gaseous reactive agent diffuse through the porous composite and make contact within the pores of the multicomponent metallic oxide. These components are reacted at a temperature and pressure sufficient to deposit a plug of metallic oxide, multicomponent metallic oxide, metallic carbonate or metal in the pores thereby reducing or eliminating any through-porosity in the inorganic membrane. Suitable reaction conditions for forming the enumerate plugs include a pressure ranging from 1 to 100 Torr and a temperature ranging from about 300° to 600° C. Reaction conditions for forming mixed conducting oxide plugs defined by the formulae previously disclosed include a temperature ranging from about 450° to 600° C. and a pressure ranging from 2 to about 10 Torr. The infiltration step is continued for a time period sufficient to deposit a plug of material sufficient to eliminate any remaining through porosity in the inorganic membrane.

The infiltration step is capable of plugging the pores of the multicomponent metallic oxide layer with a wide variety of materials which may be non-ionically conductive, ionically conductive, electronically conductive, non-electronically conductive or any combination thereof. The infiltration step can also be employed to deposit an inert pore filler, namely a filler which is not capable of conducting oxygen ions at elevated temperatures or a catalytic component such as metallic silver which is capable of enhancing separation properties of the inorganic membrane.

$BiCuVO_x$ is an example of a suitable low temperature oxygen ionic conductor, which in combination with a low temperature electronic conductor (single or multi-component metallic oxide, or metal) can form an inorganic membrane capable of being operated at relatively low temperatures. Composites formed of a porous substrate and $BiCuVO_x$ can be prepared at temperatures less than about 600° C., thereby eliminating problems associated with chemical or physical incompatibility experienced when high fabrication temperatures are used such as those employed in ECVD or conventional ceramic fabrication processes.

The following is a description of one suitable procedure for manufacturing the inorganic membranes of this invention. The desired organometallic complexes are loaded into individual stainless steel bubblers (source), with an internal volume of approximately 55 cm³, each fitted within a ⅜ inch I.D. metal feed tube capped by a ¼ inch 10 μm pore size sparger. Each source is heated by separate external heaters and is allowed to reach thermal equilibrium. An inert carrier gas (argon, helium, or nitrogen) is passed through each complex within the sources to transfer the complexes to a reactor. The inert carrier gas streams are metered by mass flow controllers. The space velocity of the inert gas through each source is in the range 0.1 to 10 sccm/cm², and, together with the source temperatures, are adjusted to achieve a dynamically stable and sufficient rate of transport of each organometallic complex employed. The organometallic-carrier gas feed line to the reactor is heated to prevent condensation of the organometallic vapors prior to entering the reactor.

The organometallic vapors and carrier gas are fed at the top of the reactor and allowed to flow past the outer surface of a heated porous tubular composite. A balance of inert gas (argon, helium, or nitrogen) may be added to the vaporous organometallic complex/carrier gas feed to adjust the total flow rate and therefore the organometallic partial pressure prior to contacting the porous tubular substrate. One or more oxidants such as oxygen, water, $N_2O$, or ozone are supplied to the inner bore of the porous tubular composite via a separate feed line.

Similarly, the oxidant may also be blended with an inert gas (argon, helium, or nitrogen) to adjust the total flow rate and therefore the oxidant partial pressure, prior to contacting the porous composite. The porous support layer of the porous composite may be fabricated from (i) a suitable ceramic oxide such as MgO, calcia-stabilized $ZrO_2$, yttria-stabilized $ZrO_2$, or a multicomponent metallic oxide; (ii) an oxygen compatible metal such as nickel or a metal alloy such as Inconel 625; or (iii) an oxygen compatible non-oxide ceramic such as SiC.

The deposition step is performed within the preferred temperature range of 350°-600° C., where the porous composite is heated by convection from the hot reactor wall, and the preferred deposition pressure of 1-70 Torr. The upper temperature limit is set below the measured vapor phase thermal decomposition temperatures of the organometallic complexes. At the upper OMCVI limit, chemical reactions of the deposited layer and the porous support and sintering of the support layer are minimal. Microwave plasma and uv irradiation can be utilized to facilitate plug formation. The upper OMCVI reaction temperature is set to minimize deleterious chemical reactions between the deposited plug and the porous composite and to prevent sintering of the support layer.

The present method overcomes limitations associated with prior art methods for depositing barium-containing multicomponent metallic oxides onto a zirconia support wherein barium zirconate is typically formed at the elevated reaction temperatures of greater than about 950° C. required to deposit the film. Barium zirconate formation has been eliminated because the present OMCVI method is conducted at temperatures substantially lower than 950° C.

The claimed method can also produce sub-micron crystallites under the conditions employed which readily sinter at low temperatures, ca. 800° C. Therefore, residual through-porosity in the multicomponent metallic oxide layer can be eliminated to the extent desired by heat treatment at unexpectedly low temperatures such that the support structure is not adversely affected. Such temperatures are substantially below those reported in the literature for the liquid suspension spray deposition technique (1400° C.) wherein extensive sintering of the porous support structure would be expected.

The following examples are provided to further illustrate Applicants' method for making the inorganic membranes of the present invention. The examples are illustrative and are not intended to limit the scope of the appended claims.

EXAMPLE 1

Preparation of Lanthanum-tris (2,2,6,6-tetramethyl-3,5-heptanedionate) La(thd)₃

La(thd)₃ was purchased from Strem Company, Newburyport, Mass. The material was initially sublimed at 120° C. under vacuum. The material was then sublimed at 250° C. to 260° C. and yielded a pure material which showed no apparent decomposition at 200° C. under vacuum conditions.

EXAMPLE 2

Preparation of Strontium-bis(2,2,6,6-tetramethyl-3,5-heptanedionate) Sr(thd)₂

Sr(thd)₂ was purchased from Strem Company, Newburyport, Mass. The material was initially sublimed at 120° C. under vacuum and provided a small amount of yellow oil on the cold finger. The material was then sublimed at 250° C. to 260° C. and yielded a pure material which showed no apparent decomposition at 200° C. under vacuum conditions.

EXAMPLE 3

Preparation of [Barium-bis(2,2,6,6-tetramethyl-3,5-heptanedionate)]$_4$ (Ba)$_4$(thd)$_8$ The following generic synthetic method was used to prepare (Ba)$_4$(thd)$_8$. 2,2,6,6-tetramethyl-3,5-heptanedione (0.5 moles) was slowly added to barium hydride (0.25 moles) as a stirred slurry in 300 ml of tetrahydrofuran (THF) under a vented atmosphere of nitrogen gas. Hydrogen gas evolution was observed. The reaction mixture was gently warmed to an overnight reflux after the bubbling caused by gas evolution had subsided. Solid impurities were filtered from the solution after the mixture had cooled. THF was stripped from the clear tiltrate by applying a vacuum initially at room temperatures and then by slowly heating the solution to a maximum of 150° C. until no further volatiles emerged from the crude product. The crude product was sublimed one or more consecutive times at 50 Torr at 230°–250°°C. The average yield obtained during each synthesis was 80%. Elemental microanalysis conducted on four different samples provided the following range of percentages:

Found: C 52.16–52.49%; H 7.70–7.76%, Calculated: C 52.44%; H 7.54%; Ba 27.26%

The above-mentioned elemental analyses were in agreement with the theoretical values. The barium concentration was determined by ICPAA (inductively coupled plasma atomic absorption) analysis and found to be 28.0± 0.2% Ba (at the 95% confidence interval with three replicates) in close agreement with the theoretical value.

EXAMPLE 4

Preparation of Cobalt-bis(2,2,6,6-tetramethyl-3,5-heptanedionate) Co(thd)$_2$

Co(thd)$_2$ was prepared on a 0.0940 mol scale by adding 17.3 g of 2,2,6,6-tetramethyl-3,5-heptanedione (obtained from Aldrich Chem. Co., Milwaukee, Wis.) to cobalt acetate in aqueous methanol. The resulting solution was neutralized to a pH of 8 with ammonium hydroxide to provide a pink slurry. Following sublimation under vacuum, a volatile white powder was removed from the complex, the powder being identified as ammonium acetate. The material was extracted with a water/ether solution to remove ammonium acetate. A series of sublimations at 150° C. under vacuum provided a 54% yield of the ruby-red crystalline solid product.

EXAMPLE 5

Preparation of Iron-tris(2,2,6,6-tetramethyl-3,5-heptanedionate) Fe(thd)$_3$

Fe(thd)$_3$ was prepared on a 0.181 mol scale by adding 3 eq mol of 2,2,6,6-tetramethyl-3,5-heptanedione to FeCl$_3$•6H$_2$O dissolved in water. Excess sodium acetate (0.0724 mol) was added to the FeCl$_3$•6H$_2$O solution as a buffer. The resulting orange emulsion was treated with ammonium hydroxide to adjust the pH to 10 providing a slurry of the same color. The crude product was purified by sublimation under vacuum at 150° C. A dark orange crystalline solid was obtained in 43% yield.

EXAMPLE 6

OMCVI of Cobalt Oxide onto a Yttria-Stabilized Zirconia Tubular Substrate

A standard CVD reactor was divided into two chambers by a porous ceramic tube, 30.5 cm in length, fabricated from yttria-stabilized zirconia (YSZ) obtained from Kyocera Industrial Ceramics Corporation. The tube had a 1.2 cm outside diameter, a 0.9 cm inside diameter and a porosity of 32% by volume with an average pore diameter of 0.8 $\mu$m. Co(thd)$_2$ was heated at 118° C. in a stainless steel bubbler to form organometallic vapors which were carried in a 20 sccm flow of nitrogen and transported through heated lines to the reactor ceramic tube shell side where the vapors were further diluted with 30 sccm of nitrogen.

A mixture of oxygen (10 sccm) and nitrogen (40 sccm) was supplied to the bore of the ceramic tube to produce an oxygen/Co(thd)$_2$ feed ratio of 54. The tube was heated to 450° C. and both the tube bore and shell sides were maintained at 2 Torr for five hours which resulted in a layer of Co$_3$O$_4$ and CoO being deposited into the pores of the porous support and onto the surface of the porous support. Following infiltration, the tube was still porous and no discernible reduction in gas flow through the tube wall at an equivalent pressure drop was observed. The deposited layer was analyzed by x-ray diffraction, which indicated a mixture of Co$_3$O$_4$ and CoO had infiltrated the YSZ tube.

EXAMPLE 7

OMCVI of Metallic Cobalt/Cobalt Oxide onto a Yttria-Stabilized Zirconia Tubular Substrate Example 6 was repeated using a new YSZ tube. The Co(thd)$_2$ bubbler was maintained at 115° C., the Co(thd)$_2$ vapor/carrier gas stream was blended with 80 sccm of nitrogen and H$_2$O was used as the oxidant. H$_2$O vapor was transported to the reactor in a 50 sccm carrier gas stream of nitrogen, bubbled through a H$_2$O reservoir held at 4.6°±1.2.° C. The H$_2$O/Co(thd)$_2$ feed ratio was ~48, and both the tube bore and shell were maintained at 10 Torr. The infiltration was conducted at a temperature of 500° C. No change in tube porosity was observed following the infiltration. However, the deposited film was shown by x-ray diffraction to be a mixture of hexagonal and cubic phases of cobalt and CoO which was present as a minor phase.

Examples 6 and 7 illustrate the difficulty of totally closing pores of 0.8 $\mu$m diameter by OMCVI although the technique is able to deposit oxide or metallic material within the pore structure of the porous support.

EXAMPLE 8

Preparation of A La$_{0.2}$Ba$_{0.8}$Co$_{0.8}$Fe$_{0.2}$O$_{3-z}$ Slurry for Dip Coating and Infiltration La$_{0.2}$Ba$_{0.8}$Co$_{0.8}$Fe$_{0.2}$O$_{3-z}$, which may be prepared according to prior art procedures, was calcined at 875° C. for 40 hours. The calcined multicomponent metallic oxide powder was milled to a mean particle size of about 2 $\mu$m and exhibited a narrow distribution about the mean. La$_{0.2}$Ba$_{0.8}$Co$_{0.8}$Fe$_{0.2}$O$_{3-z}$ powder (10.0 g), polyvinylbutyral (50 g), Menhaden fish oil (10 g), methanol (80 mL), and 2-butanone (120 mL) were combined. A dispersion was formed by ball milling the slip for 40 hours using zirconia media and polyethylene jars. Slips prepared in this way are stable, well dispersed, and consist of submicron powder.

EXAMPLE 9

Deposition of a Porous $La_{0.2}Ba_{0.8}Co_{0.8}Fe_{0.2}O_{3-z}$ onto a Magnesia Tubular Support by Dipcoating A porous MgO tube which was closed at one end (supplied by Ozark Technical Ceramics, Inc., Webb City, Mo.) having a length of 5 cm, an outer diameter of 1.2 cm and an inner diameter of 0.9 cm, a porosity of 30% by volume and an average pore diameter of 1 μm, was pre-cleaned in methylene chloride and dried. The MgO tube was treated by dip coating/slip casting using the slurry described in Example 8.

The dry MgO tube was immersed in the slip slowly, held in the slip for 45 seconds, withdrawn at 2 cm/min., and allowed to dry. The immersion-withdrawal-drying procedure was repeated 13 times with sintering after the third, eighth and thirteenth dips for one hour at a temperature of 1080°, 1050°, and 1025° C., respectively. The procedure deposited a continuous, adherent 8 μm thick multicomponent metallic oxide layer having an average pore diameter of less than 0.15 μm pore diameter onto the porous magnesium oxide support.

EXAMPLE 10

Deposition of a Porous $La_{0.2}Ba_{0.8}Co_{0.8}Fe_{0.2}O_{3-z}$ onto a Magnesia Tubular Substrate by Vacuum Filtration A porous MgO tube having the same properties as disclosed in Example 9 was pre-cleaned in methylene chloride and dried. The slurry of Example 8 was deposited onto the MgO tube by vacuum filtration according to the following procedure. The dry porous support tube was slowly immersed in the slip and the pressure on the bore of the tube was reduced by applying a vacuum. The vacuum was held for 2 minutes, released and the tube was withdrawn from the slip at 2 cm/min, and allowed to dry. This sequence was repeated 3 times with sintering for one hour after each step at a temperature of 1080°, 1050°, and 1025° C., respectively. A continuous, adherent 5 μm thick multicomponent metallic oxide layer having an average pore diameter of less than 0.15 μm was deposited onto the porous MgO support. The structure formed by vacuum filtration had a higher density and was more conformal to the MgO substrate than the layer formed by dip coating/slip casting.

EXAMPLE 11

Deposition of $La_{0.2}Ba_{0.8}Co_{0.8}Fe_{0.2}O_{3-z}$ onto a Magnesia Tubular Substrate by Dipcoating A porous MgO tube having the same properties as disclosed in Example 9 was pre-cleaned in methylene chloride and dried. A layer of $La_{0.2}Ba_{0.8}Co_{0.8}Fe_{0.2}O_{3-z}$ was deposited onto the MgO tube by dipcoating/slip casting according to the procedure of Example 8. The dry porous support tube was immersed in the slip slowly, held in the slip for 45 seconds, withdrawn at 2 cm/min, and allowed to dry. The immersion-withdrawal-drying procedure was repeated 21 times with sintering after the 3rd, 8th, 11th, 16th and 21st dips at temperatures of 1080°, 1080°, 1080°, 1100°, and 1200° C. respectively. One hour holds at the sintering temperature were used for the first three sinterings and 5 hour holds at the sintering temperature were used for the last two. This procedure resulted in a large grain size film which is adherent on the MgO substrate but is discontinuous and still porous. This Example illustrates that it is difficult to form a dense pore free layer by high temperature sintering of a dip coated or vacuum filtration layer.

EXAMPLE 12

OMCVI of Metallic Cobalt/Cobalt Oxide onto a Porous Composite of MgO and $La_{0.2}Ba_{0.8}Co_{0.8}Fe_{0.2}O_{3-z}$ A composite membrane comprising a MgO porous support and a layer of $La_{0.2}Ba_{0.8}Co_{0.8}Fe_{0.2}O_{3-z}$ was prepared according to Example 9. The reactor pressure was maintained at 20 Torr in the inner bore of the composite membrane and 10 Torr on the outer surface of the composite membrane and the temperature was maintained at 460° C. A mixture of $H_2O$/oxygen/nitrogen was fed to the inner bore of the composite membrane and vaporized Co(thd)$_2$ (126° C.) was supplied in a carrier gas of nitrogen to the outer surface of the composite membrane. Infiltration was performed for a total of 19.5 hours.

An experiment was performed to test the effect that infiltration had on plugging the pores of the multicomponent metallic oxide layer wherein nitrogen at 50 sccm was passed through the tube at 460° C. Substantial pore plugging of the oxide layer was observed as evidenced by the pressure drop changing from 68.5 Torr before infiltration to 513.4 Torr following infiltration. The residual porosity in the membrane was attributed to flaws in the technique used to close one end of the MgO tube. The membrane was submerged in acetone at room temperature and subjected to pressure and the bubbles produced indicated that the walls of the membrane had been sealed.

This Example illustrates the advantages of using a composite porous membrane wherein OMCVI and slurry coating techniques are employed to manufacture thin inorganic membranes.

EXAMPLE 13

Oxygen Permeation Test of a Composite Membrane Formed of MgO, $La_{0.2}Ba_{0.8}Co_{0.8}Fe_{0.2}O_{3-z}$ and Metallic Cobalt/Cobalt Oxide The oxygen transport properties of the composite tube made in Example 12 were tested in the following manner. The open end of the composite tube made in Example 12 was attached to an alumina tube by placing a glass ring with a softening temperature of 810° C. between the composite tube and the alumina tube. A vacuum pump was connected to the other end of the alumina tube. The composite tube assembly was heated to 857° C. where the glass softened and a seal was obtained between the composite tube and the alumina tube. 1000 sccm of air was fed to the exterior of the composite tube. The pressure of the gas on the exterior of the composite tube was 1 atm. The pressure inside the composite tube was lowered to 10 Torr with the vacuum pump. The flow rate of gas exiting the pump was 125 sccm. The composition of the gas exiting the pump was measured with a paramagnetic oxygen analyzer. The composition of the gas exiting the pump was 26% (by volume). Therefore, the oxygen to nitrogen selectivity of the membrane was 1.3.

This Example illustrates that an inorganic membrane made by the method of this invention can be utilized to separate oxygen from an oxygen-containing gaseous mixture at elevated temperatures and that the membrane has sufficient mechanical strength to withstand a differential pressure of approximately 1 atm.

EXAMPLE 14

Deposition of $La_{0.2}Ba_{0.8}Co_{0.8}Fe_{0.2}O_{3-z}$ onto a Magnesia Tubular Substrate by Vacuum Filtration A porous MgO tube having the same properties as disclosed in Example 9 was pre-cleaned in methylene chloride and dried. The slurry of Example 8 was deposited onto the MgO tube by vacuum filtration according to the following procedure. The dry porous tube was immersed in the slip at a rate of 1 cm/sec. After the immersion was complete, pressure on the bore of the tube was reduced by an applied vacuum. The vacuum was held for 2 minutes, then released, the tube was withdrawn from the slip at 3 cm/min., the coated tube was allowed to dry and was sintered to a maximum temperature of 1100° C. The vacuum filtration-withdrawal-drying procedure was repeated with sintering at 1050° C. One hour holds at the sintering temperature were used in both cases. This procedure resulted in a continuous, adherent 12 $\mu$m thick layer having an average pore diameter of 0.15 $\mu$m was deposited onto the MgO support. The structure formed by vacuum filtration has a higher density and is more conformal to the MgO substrate that the layer formed by dip coating/slip casting.

EXAMPLE 15

OMCVI Modification of a Supported Porous $La_{0.2}Ba_{0.8}Co_{0.8}Fe_{0.2}O_{3-z}$ Layer with Cobalt and Barium Oxide/Carbonate Cobalt and barium oxide/carbonate was deposited into the pores of the thin supported porous layer of $La_{0.2}Ba_{0.8}Co_{0.8}Fe_{0.2}O_{3-z}$ oxide described in Example 14. The OMCVI procedure was a variation of that described in Example 7. A mixture of oxygen/nitrogen was fed to the inner bore of the MgO support. Co(thd)$_2$ was held at 126° C. and (Ba)$_4$(thd)$_8$ at 243° C. in their respective bubblers, and supplied in carrier gas flows of nitrogen to the outer surface of the $La_{0.2}Ba_{0.8}Co_{0.8}Fe_{0.2}O_{3-z}$ layer. OMCVI was performed for a total of 13.5 hours. The pressure drop across the wall of the tube changed from 22 Torr before infiltration to 296 Torr following infiltration, for 50 sccm of nitrogen flowing through the tube at 460° C.

EXAMPLE 16

Oxygen Permeation Test of a Membrane Composite Formed of MgO, $La_{0.2}Ba_{0.8}Co_{0.8}Fe_{0.2}O_{3-z}$ and Cobalt and Barium Oxide/Carbonate The oxygen transport properties of the composite tube made in Example 15 were tested in the following manner. The open end of the composite tube was attached to an alumina tube by placing a glass ring with a softening temperature of 810° C. between the composite tube and the alumina tube. A vacuum pump was connected to the other end of the alumina tube. The composite tube assembly was heated to 857° C. where the glass softened and a seal was obtained between the composite tube and the alumina tube. 1000 sccm of air was fed to the exterior of the tube. The pressure of the gas on the exterior of the tube was 1 atm. The pressure inside the tube was lowered to 1 Torr with the vacuum pump. The flow rate of gas exiting the pump was 330 sccm. The composition of the gas exiting the pump was measured with a paramagnetic oxygen analyzer. The composition of the gas exiting the pump was 35% (by volume). Therefore, the oxygen to nitrogen selectivity of the membrane was 2.0.

This Example illustrates that a thin film mixed conducting membrane made by the process of this invention can be utilized to separate oxygen from an oxygen containing gas stream at elevated temperatures, and has sufficient strength to withstand a differential pressure of $\sim 1$ atm.

EXAMPLE 17

Deposition of $La_{0.2}Ba_{0.8}Co_{0.8}Fe_{0.2}O_{3-z}$ onto a Magnesia Tubular Substrate by Vacuum Filtration A slurry of $La_{0.2}Ba_{0.8}Co_{0.8}Fe_{0.2}O_{3-z}$ was prepared according to the procedure of Example 8, except the solvents methanol and 2-butanone were replaced with toluene (160 mL) and ethanol (40 mL). The procedure of Example 14 was repeated using this slurry. The procedure resulted in the deposition of a continuous, adherent 10 $\mu$m thick layer having an average pore diameter of about 0.15 $\mu$m. This Example demonstrates that a variety of solvent systems can be used to form inorganic membranes comprising a $La_{0.2}Ba_{0.8}Co_{0.8}Fe_{0.2}O_{3-z}$ layer of controlled average pore diameter.

EXAMPLE 18

OMCVI Modification of a Supported Porous $La_{0.2}Ba_{0.8}Co_{0.8}Fe_{0.2}O_{3-z}$ Layer with MgO MgO was introduced into the pores of a 7 $\mu$m supported porous layer of $La_{0.2}Ba_{0.8}Co_{0.8}Fe_{0.2}O_{3-z}$ on a MgO support by the OMCVI procedure of Example 15. The ceramic tube was maintained at 510° C. A mixture of H$_2$O, oxygen, and inert gases was fed to the inner bore of the MgO support. Mg(thd)$_2$ was held at 160° C. in a bubbler, and supplied in a carrier gas of nitrogen to the outer surface of the $La_{0.2}Ba_{0.8}Co_{0.8}Fe_{0.2}O_{3-z}$ layer. The H$_2$O source was held at 37° C., and the vapor was transported to the reactor in a 30 sccm carrier gas stream of nitrogen. OMCVI was performed at these conditions for a total of 15 hours. The pressure drop across the wall of the tube changed from 35 Torr before infiltration to 685 Torr following infiltration, for 50 and 30 sccm of nitrogen, respectively, flowing through the tube at 510° C., indicating the porous layer had been modified. Following the oxygen permeation test (Example 19), analysis of the tube by scanning electron microscopy indicated that the MgO had successfully infiltrated the porous ITM oxide layer and in addition produced a continuous dense $\sim 0.5$ $\mu$m overcoating layer of MgO on the outer surface of the tube.

EXAMPLE 19

Oxygen Permeation Test of a Membrane Composite of MgO/$La_{0.2}Ba_{0.8}Co_{0.8}Fe_{0.2}O_{3-z}$/MgO The oxygen transport properties of inorganic membrane made in Example 18 were tested in the following manner. The open end of the composite tube was attached to an alumina tube by placing a glass ring with a softening temperature of 810° C. between the composite tube and the alumina tube. A vacuum pump was connected to the other end of the alumina tube. The composite tube assembly was heated to 857° C. where the glass softened and a seal was obtained between the composite tube and the alumina tube. 1000 sccm of air was fed to the exterior of the tube. The pressure of the gas on the exterior of the tube was 1 atm. The pressure inside the tube was lowered to 1 Torr with the vacuum pump. The composition of the gas exiting the pump was measured with a paramagnetic oxygen analyzer. The composition of the gas exiting the pump was 20.9% oxygen. Therefore, the oxygen to nitrogen selectivity of the membrane was 1.0.

This Example illustrates that if the combination of OMCVI and slurry coating processes described in Examples 17 and 18 results in the depositing of a thin continuous overcoating of an inert material, MgO, on the outer surface of the tube, then the mixed conducting membrane is prevented from selectively separating oxygen from air. The overcoating can be eliminated by conventional mechanical abrasion or chemical etching techniques known in the art. For example, the tube can be placed in a cylindrical jar with MgO powder. The jar is rotated about its axis on a ball mill at 30 rpm for one hour to mechanically abrade the outer surface of the tube. The tube is then removed from the jar and the abradant MgO powder and cleaned in dichloromethane in an ultrasonic bath.

EXAMPLE 20

Oxygen Permeation Test of a Membrane Composite of $MgO/La_{0.2}Ba_{0.8}Co_{0.8}Fe_{0.2}O_{3-z}/BaO$ The procedure described in Example 17 is repeated to produce a continuous adherent layer of $La_{0.2}Ba_{0.8}Co_{0.8}Fe_{0.2}O_{3-z}$, ~8 μm thick with an average pore diameter of ~0.15 μm, on the outer surface of a porous MgO tube, 1.2 cm od. and 15 cm long, closed at one end and having a porosity of 30% and a mean pore diameter of 1 μm. The procedure of Example 18 is then repeated to infiltrate the porous layer of $La_{0.2}Ba_{0.8}Co_{0.8}Fe_{0.2}O_{3-z}$ with $BaO/BaCO_3$ by OMCVI, using $(Ba)_4(thd)_8$ as the organometallic precursor. The $(Ba)_4(thd)_8$ is held in a bubbler at 243° C. and its vapor is supplied in a carrier stream of nitrogen to the outer surface of the slurry coated ceramic tube at 10 Torr and 460° C. A mixture of oxygen and nitrogen is supplied at 10-20 Torr to the inner bore of the tube, and $BaO/BaCO_3$ is deposited in the $La_{0.2}Ba_{0.8}Co_{0.8}Fe_{0.2}O_{3-z}$ layer by the OMCVI process. The OMCVI is continued until an in-situ nitrogen pressure test indicates that the pores are closed. In addition to closing the porosity with BaO, the outer surface of the tube is coated with an adherent layer of $BaO/BaCO_3$, <0.5 μm thick.

The tube is then used to separate oxygen from air by selective oxygen transport, in the manner described in Example 16. The open end of the tube is attached to an alumina tube by placing a glass ring with a softening temperature of 810° C. between the mixed conducting membrane tube and alumina tube. A vacuum pump is connected to the other end of the alumina tube, and the tube assembly is heated to 857° C. where the glass softens and seals the mixed conducting membrane tube and the alumina tube. Air is supplied to the exterior of the tube at a flow rate of 1000 sccm and a pressure of 1 atm. The pressure inside the tube is reduced to subatmospheric with the aid of the vacuum pump, and oxygen is selectively transported through the membrane layer to the interior of the tube and recovered from the vacuum pump exhaust.

This Example illustrates that the overcoating of $BaO/BaCO_3$ that results from the OMCVI procedure does not totally impede the transport of oxygen through the sublayer of $La_{0.2}Ba_{0.8}Co_{0.8}Fe_{0.2}O_{3-z}$ infiltrated with BaO. The tube is used to separate oxygen from air without the need to undergo the mechanical abrasion described in Example 19 to remove the outerlayer.

EXAMPLE 21

Oxygen Permeation Test of a Membrane Composite of $MgO/La_{0.2}Ba_{0.8}Co_{0.8}Fe_{0.2}O_{3-z}/La_{0.2}Ba_{0.8}Co_{0.8}Fe_{0.2}O_{3-z}$ The procedure described in Example 17 is repeated to produce a continuous adherent layer of $La_{0.2}Ba_{0.8}Co_{0.8}Fe_{0.2}O_{3-z}$, ~8 μm thick with an average pore diameter of ~0.15 μm, on the outer surface of a porous MgO tube, 1.2 cm od. and 15 cm long, closed at one end, and having a porosity of 30% and a average pore diameter of 1 μm. The procedure of Example 18 is then repeated to infiltrate by OMCVI the porous layer of $La_{0.2}Ba_{0.8}Co_{0.8}Fe_{0.2}O_{3-z}$ with $La_{0.2}Ba_{0.8}Co_{0.8}Fe_{0.2}O_{3-z}$, by OMCVI using $La(thd)_3$, $(Ba)_4(thd)_8$, $Co(thd)_2$ and $Fe(thd)_3$ as the organometallic precursors, held in individual bubblers at 190°, 220°, 120° and 120° C., respectively.

The mixture of organometallic vapors is supplied to the outer surface of the ceramic tube at 10 Torr and 500°-550° C. in a carrier stream of nitrogen, while a mixture of oxygen and nitrogen is supplied at 10-20 Torr to the inner bore of the tube. The OMCVI reaction is run to completion, closing the porosity of the $La_{0.2}Ba_{0.8}Co_{0.8}Fe_{0.2}O_{3-z}$ layer with $(La_xBa_{1-x})(Co_yFe_{1-y})O_{3-z}$ but in addition overcoating the outer surface of the tube with a layer of $(La_xBa_{1-x})(Co_yFe_{1-y})O_{3-z}$, <1 μm thick.

The tube is then used to separate oxygen from air by selective oxygen transport, in the manner described in Example 16. The open end of the tube is attached to an alumina tube by placing a glass ring with a softening temperature of 810° C. between the mixed conducting membrane tube and alumina tube. A vacuum pump is connected to the other end of the alumina tube, and the tube assembly is heated to 857° C. where the glass softens and seals the mixed conducting membrane tube and the alumina tube. Air is supplied to the exterior of the tube at a flow rate of 1000 sccm and a pressure of 1 atm. The pressure inside the tube is reduced to subatmospheric with the aid of the vacuum pump, and oxygen is selectively transported through the membrane layer to the interior of the tube and recovered from the vacuum pump exhaust.

This Example illustrates that the overcoating of $(La_xBa_{1-x})(Co_yFe_{1-y})O_{3-z}$ that results from the OMCVI procedure does not totally impede the transport of oxygen through the sublayer of $La_{0.2}Ba_{0.8}Co_{0.8}Fe_{0.2}O_{3-z}$ infiltrated with $(La_xBa_{1-x})(Co_yFe_{1-y})O_{3-z}$. The tube is used to separate oxygen from air without the need to undergo the mechanical abrasion described in Example 19 to remove the outerlayer.

EXAMPLE 22

Oxygen Permeation Test of a Membrane Composite of $MgO/Bi_2V_{0.9}Cu_{0.1}O_{5.35}/Nickel$ The procedure described in Example 14 is used to produce a continuous adherent layer of $Bi_2V_{0.9}Cu_{0.1}O_{5.35}$, ~5 μm thick with an average pore diameter of ~0.1 μm, on the outer surface of a porous MgO tube, 1.2 cm od. and 15 cm long, closed at one end, and having a porosity of 30% and a average pore diameter of 1 μm. The $Bi_2V_{0.9}Cu_{0.1}O_{5.35}$ powder is prepared by intimately mixed and grinding powders of the individual oxides, heating the mixture in ar to 650° C., cooling, regrinding and reheating in air at 850° C. for 48 hours. A slip is then prepared from the remilled calcined powder according to the method described in Example 14 and the MgO porous support tube is coated with the slip by the vacuum filtration method described in Example 14 except that following the vacuum infiltration steps, the tube is sintered to a maximum temperature of 850° C.

The procedure of Example 18 is then repeated to infiltrate by OMCVI the porous layer of $Bi_2V_{0.9}Cu_{0.1}O_{5.35}$ with metallic nickel, using $Ni(hfac)_2$ as the organometallic complex and hydrogen as the gaseous reactive agent. The $Ni(hfac)_2$ is held in a bubbler at 90° C. and its vapor is supplied in a carrier stream of nitrogen to the outer surface of the slurry coated tube at 10 Torr and 350° C. A mixture of hydrogen and nitrogen is supplied at 10–15 Torr to the inner bore of the tube and metallic Ni is deposited into the pores of the $Bi_2V_{0.9}Cu_{0.1}O_{5.35}$ layer by OMCVI. The OMCVI is continued until an in-situ nitrogen pressure test indicates that the pores are closed.

The tube is then used to separate oxygen from air by selective oxygen transport in the manner described in Example 16. The open end of the tube is attached to an alumina tube by placing a glass ring with a softening temperature of about 700° C. between the mixed conducting membrane tube and the alumina tube. A gas flow meter and oxygen analyzer are connected to the other end of the alumina tube and the tube assembly is heated to 700°–750° C. where the glass softens and seals the mixed conducting membrane tube and the alumina tube. Air is supplied to the exterior of the tube at a flow rate of 1000 sccm and a pressure of 6 atm. Oxygen is selectively transported through the membrane layer to the interior of the tube and recovered from the interior of the tube at approximately atmospheric pressure.

This Example illustrates that the method of this invention can be used to form a composite of MgO and $Bi_2V_{0.9}Cu_{0.1}O_{5.35}$, an oxygen ionic conducting material, wherein the pores of the $Bi_2V_{0.9}Cu_{0.1}O_{5.35}$ are filled with an electronic conductor, nickel metal. Both phases of the composite have connectivity and conductivity extending through the OMCVI infiltrated layer allowing oxygen to be selectively transported through the composite membrane by ionic conduction under the action of an oxygen partial pressure gradient.

The inorganic membranes of the present invention can be operated to separate oxygen from oxygen-containing gaseous mixtures utilizing known apparatus such as that disclosed in U.S. Pat. No. 5,035,727, issued to Air Products and Chemicals, Inc., Allentown, Pa., the Specification and Claims which are specifically incorporated by reference herein and made a part of this application. The following general example is provided.

Oxygen may be selectively separated from an oxygen-containing gaseous mixture using the membranes of the present invention by providing two gaseous atmospheres having a difference in oxygen partial pressure through the membrane and heating the membrane to a temperature sufficient for the solid electrolyte to exhibit oxide ion conductivity whereby oxygen in a gaseous atmosphere having a higher oxygen pressure migrates electrochemically through the membrane toward the other gaseous atmosphere having a low oxygen pressure and is thus separated and received in the latter. The rate of permeation is determined not only by the rate of diffusion within the membrane but also by the interfacial kinetics of oxygen exchange, i.e., the speed at which oxygen molecules in the feed gas are converted to mobile atomic oxygen ions in the solid phase and the speed at which these ions are converted back to oxygen molecules in the permeate gas.

The temperature at which each specific inorganic membrane will exhibit oxide ion conductivity and electron conductivity will differ depending upon the types and proportions of the metal oxides constituting the multicomponent metallic oxide. Heating should be performed at a temperature ranging from at least 400° C., and preferably from 600° C. to 1000° C. The method according to the present invention can be practiced by forming two gaseous atmospheres having a difference in the partial pressure of oxygen. For example, the two gaseous atmospheres may be provided by a method which comprises partitioning two communicating chambers gas-tight by the aforesaid membrane and exposing one of the chambers to an oxygen-containing gaseous mixture at atmospheric pressure while reducing the pressure of the other chamber. Alternately, the oxygen-containing gaseous mixture, at pressure, may be supplied to one of the chambers while the other is maintained at atmospheric or reduced pressure. Accordingly, only oxygen selectively permeates electrochemically through the membrane and oxygen gas having a high purity can be obtained in the chamber having a lower oxygen partial pressure.

The method according to the present invention provides numerous advantages over prior art processes for manufacturing inorganic membranes. The method produces uniform and conformal layers enabling complex support structures to be coated. Moreover, direct low temperature deposition promotes low stress coatings and minimizes chemical reactions and microstructural changes in the substrate compared to high temperature routes such as electrochemical vapor deposition. OMCVD also produces crystallites, which readily densify at low temperatures, ca. 800° C., enabling densification of the deposited layer at low temperatures.

Having thus described the present invention, what is now deemed appropriate for Letters Patent is set forth in the following Claims.

We claim:

1. A method for manufacturing an inorganic membrane capable of separating oxygen from an oxygen-containing gaseous mixture, the method comprising the steps of:
   (a) depositing a porous multicomponent metallic oxide layer onto a porous support to form a porous composite having a network of pores capable of transporting gases;
   (b) contacting a first surface of the porous composite with a vaporized organometallic complex and a second surface of the porous composite with a gaseous reactive agent comprising an oxidizing or reducing agent at a temperature ranging from 300° to 600° C. and a pressure sufficient to react the organometallic complex and the gaseous reactive agent to form plugs in the pores of the porous multicomponent metallic oxide layer to form an inorganic membrane having essentially no through porosity.

2. The method of claim 1 wherein the porous support has an average pore diameter of greater than 1 μm and the multicomponent metallic oxide layer has an average pore diameter of less than 1 μm.

3. The method of claim 2 wherein the depositing of the porous multicomponent metallic oxide layer onto the porous support according to step (a) is accomplished by chemical vapor deposition, dip coating or vacuum filtration.

4. The method of claim 2 wherein the depositing of the porous multicomponent metallic oxide layer onto the porous support according to step (a) is accomplished by tape casting, coextrusion, spraying or electrophoresis.

5. The method of claim 4 wherein the depositing is accomplished by plasma spraying, arc spraying, flame spraying or aerosol spraying.

6. The method of claim 3 which further comprises sintering the porous composite formed in step (a) at a temperature ranging from 500° C. to 1500° C. for a period ranging from 10 minutes to twenty-four hours prior to conducting step (b).

7. The method of claim 1 wherein the contacting of the organometallic complex and the gaseous reactive agent according to step (b) occurs at a pressure ranging from 1 to about 100 Torr.

8. The method of claim 7 wherein the organometallic complex is selected from the group consisting of $Fe(thd)_3$, $La(thd)_3$, $Co(thd)_2$, $(Ba)_4(thd)_8$, $Mg(thd)_2$ and $Sr(thd)_2$.

9. The method of claim 8 wherein the gaseous reactive agent is an oxidizing agent and the plugs comprise a metallic oxide, a metallic carbonate or a multicomponent metallic oxide.

10. The method of claim 9 wherein the oxidizing agent is selected from the group consisting of oxygen, air, ozone, $N_2O$ and water.

11. The method of claim 1 wherein the gaseous reactive agent is a reducing agent and the plugs comprise a metal or mixture of metals.

12. The method of claim 11 wherein the reducing agent is selected from the group consisting of $H_2$ and CO.

13. A method for manufacturing an inorganic membrane capable of separating oxygen from an oxygen-containing gaseous mixture, the method comprising the steps of:

(a) depositing a porous multicomponent metallic oxide layer represented by the formula $A_xA'_{x'}A''_{x''}B_yB'_{y'}B''_{y''}O_{3-z}$, where A,A',A'' are chosen from the group comprising Groups 1, 2, 3 and 15 and the F block lanthanides; and B,B',B'' are chosen from the D block transition metals according to the Periodic Table of the Elements adopted by the IUPAC wherein $0<x\leq 1$, $0\leq x'\leq 1$, $0\leq x''\leq 1$, $0<y\leq 1$, $0\leq y'\leq 1$, $0\leq y''\leq 1$, $X+x'+x''=1$, $y+Y'+y''=1$ and z is a number which renders the compound charge neutral, onto a porous support to form a porous composite having a network of pores capable of transporting gases;

(b) contacting a first surface of the porous composite with a vaporized organometallic complex and a second surface of the porous composite with a gaseous reactive agent comprising an oxidizing or reducing agent at a temperature ranging from 300° to 600° C. and a pressure sufficient to react the organometallic complex and the gaseous reactive agent to form plugs in the pores of the porous composite to form an inorganic membrane having essentially no through porosity.

14. The method of claim 13 wherein the porous support has an average pore diameter of greater than 1 $\mu$m and the multicomponent metallic oxide layer has an average pore diameter of less than 1 $\mu$m.

15. The method of claim 14 wherein the depositing of the porous multicomponent metallic oxide layer onto the porous support of step (a) is accomplished by dip coating or vacuum filtration.

16. The method of claim 14 wherein the depositing of the porous multicomponent metallic oxide layer onto the porous support of step (a) is accomplished by tape casting, coextrusion, spraying or electrophoresis.

17. The method of claim 16 wherein the depositing is accomplished by plasma spraying, arc spraying, flame spraying or aerosol spraying.

18. The method of claim 15 which further comprises sintering the porous composite formed in step (a) at a temperature ranging from 500° C. to 1500° C. for a period ranging from 10 minutes to twenty-four hours prior to conducting step (b).

19. The method of claim 13 wherein the contacting of the organometallic complex and the gaseous reactive agent according to step (b) occurs at a pressure ranging from 1 to about 100 Torr.

20. The method of claim 19 wherein the organometallic complex is selected from the group consisting of $Fe(thd)_3$, $La(thd)_3$, $Co(thd)_2$, $(Ba)_4(thd)_8$, $Mg(thd)_2$ and $Sr(thd)_2$.

21. The method of claim 20 wherein the gaseous reactive agent is an oxidizing agent and the plugs comprise a metallic oxide, a metallic carbonate or a multicomponent metallic oxide.

22. The method of claim 21 wherein the oxidizing agent is selected from the group consisting of oxygen, air, ozone, $N_2O$ and water.

23. The method of claim 13 wherein the gaseous reactive agent is a reducing agent and the plugs comprise a metal or mixture of metals.

24. The method of claim 23 wherein the reducing agent is selected from the group consisting of $H_2$ and CO.

* * * * *